(12) United States Patent
Zhang et al.

(10) Patent No.: US 10,301,939 B2
(45) Date of Patent: May 28, 2019

(54) METHOD FOR DESIGNING SUPPORTING PARAMETERS OF TRANSITION SUPPORT FOR MIXED MINING FACE OF FILLING AND FULLY-MECHANIZED MINING

(71) Applicants: CHINA UNIVERSITY OF MINING AND TECHNOLOGY, Jiangsu (CN); Pingdingshan Tianan Coal Mining Co., LTD, Henan (CN); China Pingmei Shenma Energy and Chemical Industry Group Co., LTD, Henan (CN); Xuzhou ZhongAn Science & Technology Co., Ltd., Jiangsu (CN)

(72) Inventors: Jixiong Zhang, Jiangsu (CN); Jianguo Zhang, Henan (CN); Qiang Zhang, Jiangsu (CN); Qiang Sun, Jiangsu (CN); Wei Yin, Jiangsu (CN); WeiQing Zhang, Jiangsu (CN); Hao Yan, Jiangsu (CN)

(73) Assignees: CHINA UNIVERSITY OF MINING AND TECHNOLOGY, Jiangsu (CN); Pingdingshan Tianan Coal Mining Co., LTD, Henan (CN); China Pingmei Shenma Energy and Chemical Industry Group Co., LTD, Henan (CN); Xuzhou ZhongAn Science & Technology Co., Ltd., Jiangsu (CN)

( * ) Notice: Subject to any disclaimer, the term of this patent is extended or adjusted under 35 U.S.C. 154(b) by 0 days.

(21) Appl. No.: 15/770,500

(22) PCT Filed: Nov. 18, 2016

(86) PCT No.: PCT/CN2016/106342
§ 371 (c)(1),
(2) Date: Apr. 24, 2018

(87) PCT Pub. No.: WO2017/185724
PCT Pub. Date: Nov. 2, 2017

(65) Prior Publication Data
US 2018/0314770 A1 Nov. 1, 2018

(30) Foreign Application Priority Data
Apr. 29, 2016 (CN) .......................... 2016 1 0283978

(51) Int. Cl.
*E21D 23/04* (2006.01)
*G06F 17/50* (2006.01)
(Continued)

(52) U.S. Cl.
CPC .......... *E21D 23/0481* (2013.01); *E21C 41/16* (2013.01); *E21D 23/00* (2013.01);
(Continued)

(58) Field of Classification Search
None
See application file for complete search history.

(56) References Cited

FOREIGN PATENT DOCUMENTS

| CN | 102116155 | 7/2011 |
| CN | 105464700 | 4/2016 |
| CN | 105912810 | 8/2016 |

OTHER PUBLICATIONS

Zhang Jixiong et al., "Green coal mining technique integrating mining-dressing-gas draining-backfilling-mining," Dec. 18, 2016, International Journal of Mining Science and Technology, vol. 27, pp. 17-27 (Year: 2016).*

(Continued)

*Primary Examiner* — Kamini S Shah
*Assistant Examiner* — Russ Guill
(74) *Attorney, Agent, or Firm* — JCIPRNET

(57) ABSTRACT

Disclosed is a method for designing supporting parameters of a transition support for a mixed mining face of filling and
(Continued)

fully-mechanized mining. The method includes: first, determining a total length of a mixed mining working face and a length of a filling section according to requirements of a coal mining production capacity of the mixed mining working face and a filling capacity of the filling section working face; then, establishing a mixed mining numerical model of filling and fully-mechanized mining by using three-dimensional distinct element software, and simulating and calculating a caving height of a roof of a transition section and a stress influence range of the transition section when a filling rate of a mined-out area of the filling section changes; based on a result of numerical simulation and calculation, performing curve fitting according to a correlation coefficient to obtain a functional relationship between the filling rate and the caving height and a functional relationship between the filling rate and the stress influence range of the transition section; and finally designing supporting parameters of a transition support in combination with actual engineering geological parameters. The method can provide a reference for supporting design of a support, and enables a smooth transition between a filling support and a fully-mechanized mining support for a mixed working face, thereby further enriching filling mining theories and expanding the application range of filling mining.

2 Claims, 4 Drawing Sheets

(51) Int. Cl.
G06Q 50/02 (2012.01)
E21C 41/16 (2006.01)
E21D 23/00 (2006.01)
E21F 15/00 (2006.01)

(52) U.S. Cl.
CPC .......... E21F 15/00 (2013.01); G06F 17/5009 (2013.01); G06Q 50/02 (2013.01)

(56) References Cited

OTHER PUBLICATIONS

A. Vakili et al., "A new cavability assessment criterion for Longwall Top Coal Caving," 2010, International Journal of Rock Mechanics & Mining Sciences, vol. 47, pp. 1317-1329 (Year: 2010).*

Zhang Jixiong et al., "Fully mechanised mixed mining technology involving solid backfilling and caving methods in longwall workface," published online: Feb. 18, 2016, Mining Technology, vol. 125, No. 4, pp. 205-211 (Year: 2016).*

H. Manteghi et al., "Numerical modelling for estimation of first weighting distance in longwall coal mining—A case study," 2012, 12th Coal Operators Conference, University of Wollongong, pp. 60-68 (Year: 2012).*

Liu et al, "Study and practice of selection and matching of equipments on working faces combining fully-mechanized mining with caving", Mining & Processing Equipment, Nov. 10, 2010, pp. 17-20.

Dongsheng Wang, "Research and Application of Key Technology for Mixed Fully-Mechanized Mining Combined Waste Backfilling with Caving Method", China Master's Theses Full-Text Database, May 2015, pp. 1-96.

"International Search Report (Form PCT/ISA/210)", dated Feb. 23, 2017, with English translation thereof, pp. 1-4.

* cited by examiner

METHOD FOR DESIGNING SUPPORTING PARAMETERS OF TRANSITION SUPPORT FOR MIXED MINING FACE OF FILLING AND FULLY-MECHANIZED MINING

CROSS-REFERENCE TO RELATED APPLICATON

This application is a 371 application of International PCT application Ser. No. PCT/CN2016/106342, filed on Nov. 18, 2016, which claims the priority benefit of China application No. 201610283978.2, filed on Apr. 29, 2016. The entirety of each of the above-mentioned patent application is hereby incorporated by reference herein and made a part of this specification.

BACKGROUND OF THE INVENTION

Field of the Invention

The present invention relates to a supporting design method for a transition support, and in particular, to a method for designing supporting parameters of a transition support for a mixed mining face of filling and fully-mechanized mining.

Description of Related Art

Mixed mining of filling and fully-mechanized mining refers to a coal mining system and a coal mining process in which fully-mechanized filling mining equipment and conventional fully-mechanized mining equipment are both arranged on a same working face and coordinate with each other and operate together to complete coal mining and filling operations. A mixed mining working face of filling and fully-mechanized mining is mainly composed of a filling section, a transition section, and a fully-mechanized mining section. Crucial devices such as a filling mining hydraulic support and a rear multi-hole bottom-unloading type conveyor are disposed on a filling section working face. On the working face, solid materials such as gangue and fly ash are used as fillers to fill a mined-out area in the rear, to achieve the purpose of processing solid wastes. On a working face of the fully-mechanized mining section, a conventional fully-mechanized mining method is used for coal mining. On the working face, a conventional mining hydraulic support is disposed, and a roof of a mining field caves naturally. The transition section is located between the filling section and the fully-mechanized mining section. The transition section is an area characteristic of a mixed working face. The characteristics of fracture development and mine pressure appearance of overlying rock in the area are clearly different from those in a filling section and a caving section. Currently, there is still no accurate method for designing supporting parameters of a transition support for the mixed mining working face of filling and fully-mechanized mining. A filling rate is a key factor that affects a caving height of the transition section and a stress influence range of the transition section, and research on the impact of the filling rate on the caving height and the stress influence range of the transition section enables accurate prediction of the caving height and the stress influence range of the transition section, and thus calculation of the supporting parameters such as supporting strength and number of the transition supports. This is of great significance for safe supporting of the transition support for mixed mining of filling and fully-mechanized mining.

SUMMARY OF THE INVENTION

Technical Problem

An objective of the present invention is to provide, for a problem that exists in the prior art, a simple and accurate method for designing supporting parameters of a transition support for a mixed mining face of filling and fully-mechanized mining.

Technical Solution

A supporting design method for a transition support for a mixed mining working face of filling and fully-mechanized mining in the present invention includes: first, determining a total length $L_{total}$ of a mixed mining working face and a length $L_{filling}$ of a filling section working face according to requirements of a coal mining production capacity of the mixed mining working face and a filling capacity of the filling section working face; then, establishing a mixed mining numerical model of filling and fully-mechanized mining by using 3DEC three-dimensional distinct element software according to tests of physical and mechanical parameters of coal rock in a working face area, and simulating and calculating a caving height H of a roof of a transition section and a stress influence range S of the transition section when a filling rate $\varphi$ of a mined-out area of a filling section changes; based on a result of numerical simulation and calculation, performing curve fitting according to a correlation coefficient $R^2$ to obtain a functional relationship between the filling rate $\varphi$ and the caving height H and a functional relationship between the filling rate $\varphi$ and the stress influence range S of the transition section; and finally, determining parameters of a support of the transition section in combination with actual engineering geological parameters, where specific steps of the method are as follows:

(1) determining the total length $L_{total}$ of the mixed working face and the length $L_{filling}$ of the filling section working face according to the requirements of the coal mining production capacity of the mixed mining working face and the filling capacity of the filling section working face;

(2) establishing the mixed mining numerical model of filling and fully-mechanized mining by using the 3DEC three-dimensional distinct element software according to the tests of the physical and mechanical parameters of coal rock in the working face area;

(3) under the premise that a mining height M, the total length $L_{total}$ of the mixed working face, and a length $L_{filling}$ of a filling section working face 1 are determined, simulating a caving height H of a roof of a transition section 2 and a stress influence range S of the transition section 2 when the filling rate $\varphi$ of the filling section changes;

(4) performing curve fitting according to the correlation coefficient $R^2$ to obtain the functional relationship between the filling rate $\varphi$ and the caving height H and the functional relationship between the filling rate $\varphi$ and the stress influence range S of the transition section;

(5) calculating a caving height H' of the transition section of the mixed working face according to a designed filling rate $\varphi'$ in the practical engineering, and performing calculation using the following formula to determine supporting strength of the support of the transition section:

$$F = \gamma H'$$

in which: $\gamma$ is generally 2.5 MPa/100 m; and (6) calculating a stress influence range S' of the transition section of the mixed working face according to the designed filling rate φ' in the practical engineering, and performing calculation using the following formula to determine a number of supports of the transition section:

$$N \geq n = \frac{s'}{a}$$

in which: N is a minimum positive integer greater than or equal to n, and

α is a width of a single transition support.

The filling rate φ varies in the range of 60% to 80%.

Advantageous Effect

During actual application of the method for designing supporting parameters of a transition support for a mixed mining face of filling and fully-mechanized mining of the present invention, only by determining a filling rate of a filling section of a mixed mining working face, a caving height of overlying rock of a transition section and a stress influence range of the transition section can be calculated according to a regression equation, and supporting parameters such as supporting strength and number of the transition supports can be determined through calculation. This method provides a reference for the design of supporting parameters of a transition support for a mixed mining working face of filling and fully-mechanized mining, and provides a theoretical guidance for safe supporting for the transition support for the mixed mining working face of filling and fully-mechanized mining. This design method is simple, easily feasible, and highly accurate, and can provide a reference for supporting design of a support and enables a smooth transition between a filling support and a fully-mechanized mining support for a mixed working face, thereby further enriching filling mining theories, expanding the application range of filling mining, and having a wide applicability.

Figure 1:
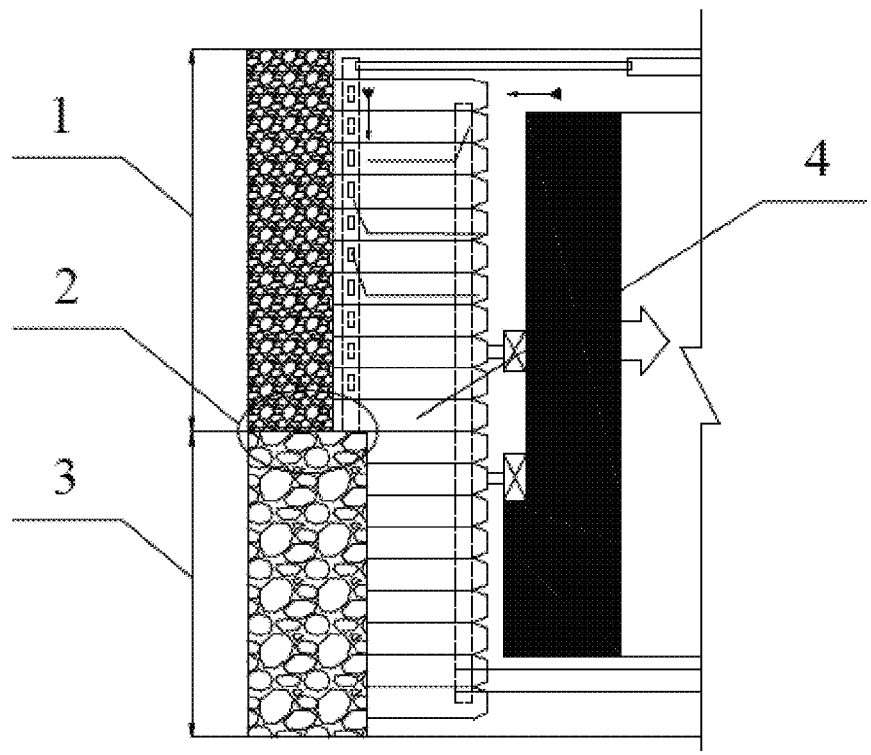
FIG. 1 shows a system arrangement of a mixed working face of filling and fully-mechanized mining according to the present invention.

In the figures: 1. Filling section; 2. Transition section; 3. Caving section; and 4. Transition section support.

DETAILED DESCRIPTION OF THE INVENTION

A supporting design method for a transition support for a mixed mining working face of filling and fully-mechanized mining in the present invention includes: first, determining a total length $L_{total}$ of a mixed mining working face and a length $L_{filling}$ of a filling section working face according to requirements of a coal mining production capacity of the mixed mining working face and a filling capacity of the filling section working face; then, establishing a mixed mining numerical model of filling and fully-mechanized mining by using 3DEC three-dimensional distinct element software according to tests of physical and mechanical parameters of coal rock in a working face area, and simulating and calculating a caving height H of a roof of a transition section and a stress influence range S of the transition section when a filling rate φ of a mined-out area of a filling section changes; based on a result of numerical simulation and calculation, performing curve fitting according to a correlation coefficient $R^2$ to obtain a functional relationship between the filling rate φ and the caving height H and a functional relationship between the filling rate φ and the stress influence range S of the transition section; and finally, determining parameters of a support of the transition section in combination with actual engineering geological parameters, where specific steps of the method are as follows:

(1) determining the total length $L_{total}$ of the mixed working face and the length $L_{filling}$ of the filling section working face according to the requirements of the coal mining production capacity of the mixed mining working face and the filling capacity of the filling section working face;

(2) establishing the mixed mining numerical model of filling and fully-mechanized mining by using the 3DEC three-dimensional distinct element software according to the tests of the physical and mechanical parameters of coal rock in the working face area;

(3) under the premise that a mining height M, the total length $L_{total}$ of the mixed working face, and a length $L_{filling}$ of a filling section working face 1 are determined, simulating a caving height H of a roof of a transition section 2 and a stress influence range S of the transition section 2 when the filling rate φ of the filling section changes;

(4) performing curve fitting according to the correlation coefficient $R^2$ to obtain the functional relationship between the filling rate φ and the caving height H and the functional relationship between the filling rate φ and the stress influence range S of the transition section;

(5) calculating a caving height H' of the transition section of the mixed working face according to a designed filling rate φ' in the practical engineering, and performing calculation using the following formula to determine supporting strength of the support of the transition section:

F=γH' in which: γ is generally 2.5 MPa/100 m; and (6) calculating a stress influence range S' of the transition section of the mixed working face according to the designed filling rate φ' in the practical engineering, and performing calculation using the following formula to determine a number of supports of the transition section:

$$N \geq n = \frac{s'}{a}$$

in which: N is a minimum positive integer greater than or equal to n, and

α is a width of a single transition support.

The filling rate φ varies in the range of 60% to 80%.

One embodiment of the present invention is further described below with reference to the accompanying drawings:

Embodiment 1: Using a mine as an example, specific implementation steps are as follows:

(1) According to production capacities of working faces of three levels of main mineable coal seams of the mine, it is designed that a total length of a first mixed mining working face (as shown in FIG. 1) with filling and caving methods is 220 m; in combination with an annual production requirement of underground gangue, the length of the filling section working face is 120 m; and a filling rate of the filling section working face varies in the range of 60% to 80%.

(2) Tests of physical and mechanical properties are performed on coal rock samples in an area of the first mixed mining working face, to obtain physical and mechanical parameters of the coal rock mass. Refer to Table 1.

TABLE 1

| Rock stratum | Bulk modulus/ GPa | Shear modulus/ GPa | Cohesion/ MPa | Tensile strength/ MPa | Angle of internal friction/° | Density/ kg · m$^{-3}$ |
|---|---|---|---|---|---|---|
| Fine sandstone | 1.63 | 1.2 | 2.5 | 1.1 | 32 | 2200 |
| Mudstone | 0.6 | 0.32 | 0.5 | 0.6 | 28 | 1600 |
| Coarse sandstone | 2.6 | 2.32 | 1.5 | 1.6 | 34 | 2400 |
| Shale | 1.87 | 1.12 | 2.0 | 1.0 | 30 | 2615 |
| Fine sandstone | 1.63 | 1.2 | 2.5 | 1.1 | 32 | 2200 |
| Mudstone | 0.6 | 0.32 | 0.5 | 0.6 | 28 | 1600 |
| Powder sandstone | 1.3 | 0.52 | 0.7 | 0.9 | 30 | 2250 |
| Fine sandstone | 1.63 | 1.2 | 2.5 | 1.1 | 32 | 2200 |
| Mudstone | 0.6 | 0.32 | 0.5 | 0.6 | 28 | 1600 |
| Coal seam | 0.8 | 0.14 | 0.3 | 0.5 | 26 | 1400 |
| Mudstone | 0.6 | 0.32 | 0.5 | 0.6 | 28 | 1600 |
| Fine sandstone | 1.63 | 1.2 | 2.5 | 1.1 | 32 | 2200 |
| Powder sandstone | 1.3 | 0.52 | 0.7 | 0.9 | 30 | 2250 |

Figure 2A:
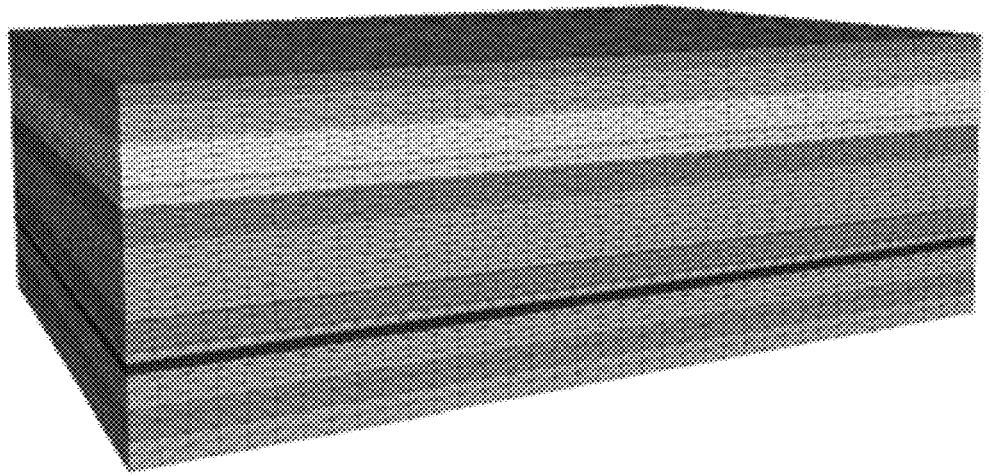
FIG. 2a shows a numerical calculation model of mining of the mixed working face of filling and fully-mechanized mining according to the present invention.
Figure 2B:
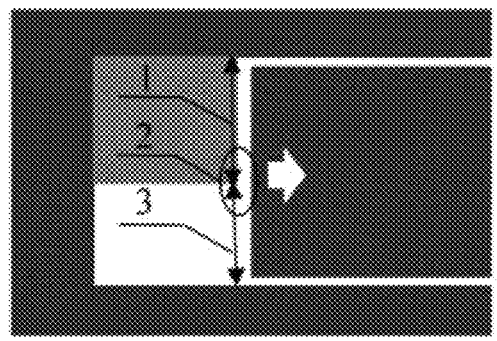
FIG. 2b is a top view of a working face of the numerical calculation model of mining of the mixed working face of filling and fully-mechanized mining according to the present invention.
Figure 2C:
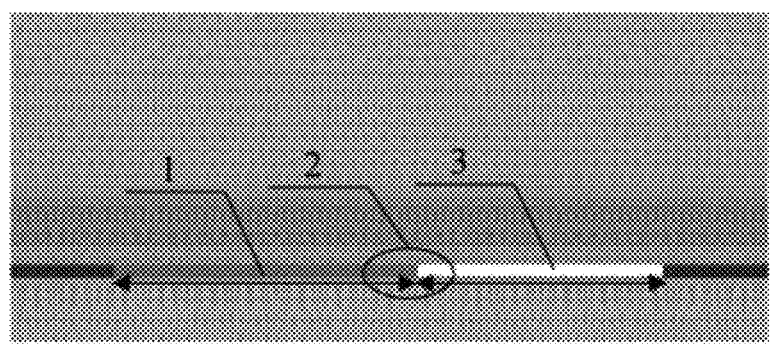
FIG. 2c is an inclined sectional view of the working face of the numerical calculation model of mining of the mixed working face of filling and fully-mechanized mining according to the present invention.

(3) According to the engineering geological conditions and the physical and mechanical parameters of coal rock mass for the filling and caving mixed working face. 3DEC numerical simulation software is used to establish a numerical calculation model, as shown in FIG. 2. The length× width×height of the model is 300 m×200 m×80 m. Displacements in the horizontal direction are restrained in the periphery, and displacements in the vertical direction are restrained at the bottom. An Mohr-Coulomb model is used for a constitutive relationship.

(4) A caving height of overlying rock of the transition section and a stress influence range of the transition section for the working face are separately simulated and calculated when the length $L_{filling}$ of the filling section remains unchanged and the filling rate φ changes. A specific simulation scheme is shown in Table 2.

TABLE 2

| Solution | Length of the filling section | Variant |
|---|---|---|
| I | 120 m | φ = 60%, 65%, 70%, 75%, 80% |

Figure 3:
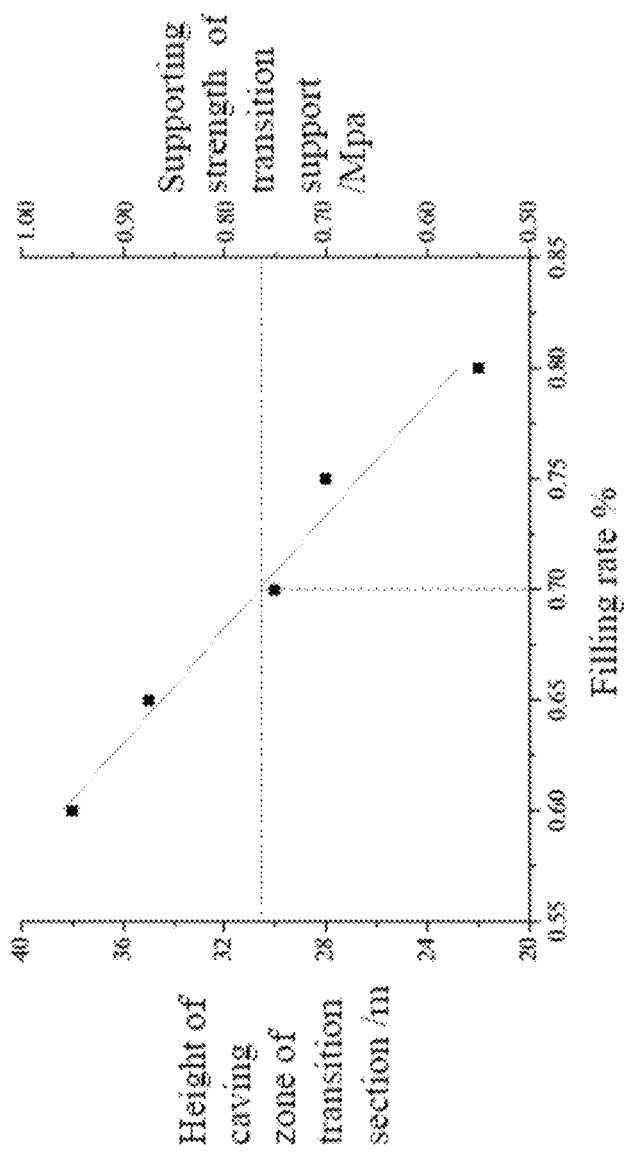
FIG. 3 is a curve diagram of a filling rate versus a height of a caving zone of a transition section for the mixed working face of filling and fully-mechanized mining according to the present invention.
Figure 4:
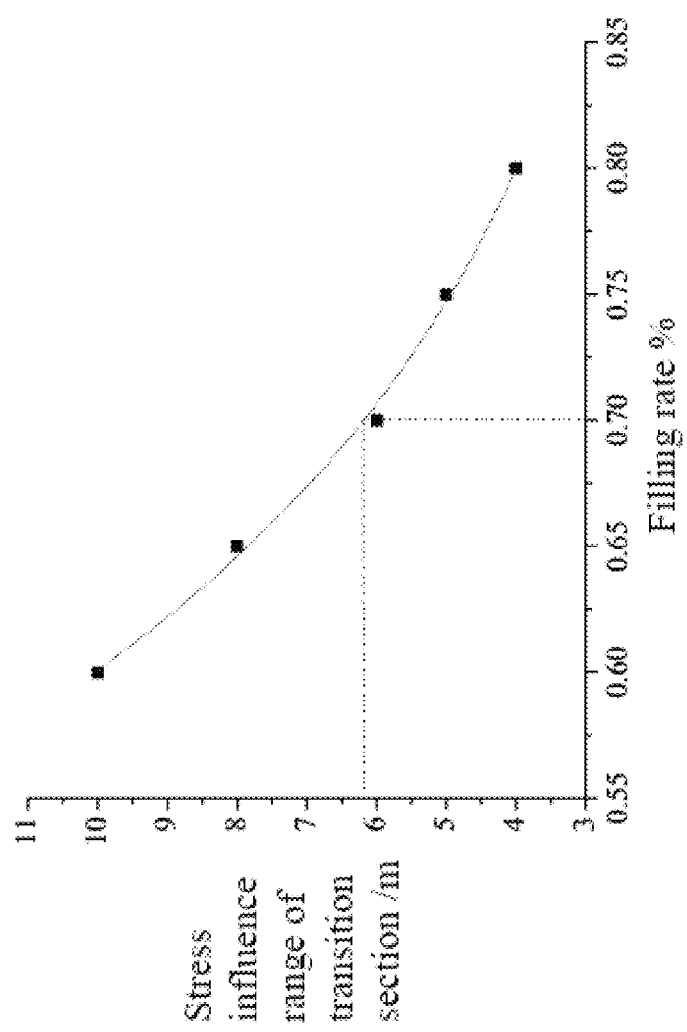
FIG. 4 is a curve diagram of a filling rate versus a stress influence range of a transition section of the mixed working face of filling and fully-mechanized mining according to the present invention.

(5) Based on the simulation result, curve fitting is performed according to a correlation coefficient $R^2$ to obtain a functional relationship between the filling rate φ and the caving height H and a functional relationship between the filling rate φ and a stress influence range S of the transition section 2, as shown in FIG. 3 and FIG. 4.

(6) An actual on-site filling rate is around 70%. It is calculated from FIG. 3 that a caving height H' of the transition section 2 of the mixed working face is about 30.5 m. The supporting strength of a support of the transition section 2 is determined through calculation:

F=γH'=0.7625 MPa in which: γ is 2.5 MPa/100 m.

(7) It is calculated from FIG. 4, according to the designed filling rate φ' in the practical engineering, that a stress influence range S' of the transition section 2 of the mixed working face is about 6.2 m, and calculation is performed using the following formula to determine the number of supports of the transition section 2:

$$N \geq n = \frac{s'}{a} = 4.13$$

in which: N is a minimum positive integer greater than or equal to n, and

α is a width of a single transition support, and is taken as 1.5 m.

Finally, taking a certain allowance coefficient into consideration, it is designed that the supporting strength of supports of the transition section is 0.84 MPa, and the number of supports of the transition section is 4.

What is claimed is:

1. A method for designing supporting parameters of a transition support for a mixed mining face of filling and fully-mechanized mining, comprising: first, determining a total length of a mixed mining working face and a length of a filling section working face according to requirements of a coal mining production capacity of the mixed mining working face and a filling capacity of the filling section working face; then, establishing a mixed mining numerical model of filling and fully-mechanized mining by using three-dimensional distinct element software according to tests of physical and mechanical parameters of coal rock in a working face area, and simulating and calculating a caving height of a roof of a transition section and a stress influence range of the transition section when a filling rate of a mined-out area of a filling section changes; based on a result of numerical simulation and calculation, performing curve fitting according to a correlation coefficient to obtain a functional relationship between the filling rate and the caving height and a functional relationship between the filling rate and the stress influence range of the transition section; and finally, determining parameters of a support of the transition section in combination with actual engineering geological parameters, wherein specific steps of the method are as follows:

(1) determining the total length of the mixed mining working face and the length of the filling section working face according to the requirements of the coal mining production capacity of the mixed mining working face and the filling capacity of the filling section working face;

(2) establishing the mixed mining numerical model of filling and fully-mechanized mining by using the three-dimensional distinct element software according to the tests of the physical and mechanical parameters of coal rock in the working face area;

(3) under the premise that a mining height, the total length of the mixed mining working face, and the length of the filling section working face are determined, simulating the caving height H of the roof of the transition section and the stress influence range of the transition section when the filling rate of the filling section changes;

(4) performing curve fitting according to the correlation coefficient to obtain the functional relationship between the filling rate and the caving height and the functional relationship between the filling rate and the stress influence range of the transition section;

(5) calculating a caving height H' of the transition section of the mixed mining working face according to a designed filling rate in practical engineering, and performing calculation using the following formula to determine supporting strength of the support of the transition section:

$$F=\gamma H'$$

in which: $\gamma$ is 2.5 MPa/100 m; and (6) calculating a stress influence range S' of the transition section of the mixed mining working face according to the designed filling rate in practical engineering, and performing calculation using the following formula to determine a number of supports of the transition section:

$$N \geq n = \frac{s'}{a}$$

in which: N is a minimum positive integer greater than or equal to n, and $\alpha$ is a width of a single transition support.

2. The method for designing supporting parameters of a transition support for a mixed mining face of filling and fully-mechanized mining according to claim 1, wherein: the filling rate varies in a range of 60% to 80%.

* * * * *